United States Patent
Tani et al.

(10) Patent No.: US 6,919,624 B2
(45) Date of Patent: Jul. 19, 2005

(54) SEMICONDUCTOR DEVICE WITH EXPOSED ELECTRODES

(75) Inventors: Takayuki Tani, Gunma (JP); Takao Shibuya, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/650,433

(22) Filed: Aug. 28, 2003

(65) Prior Publication Data

US 2004/0070067 A1 Apr. 15, 2004

(30) Foreign Application Priority Data

Aug. 28, 2002 (JP) .................................... P.2002-248111

(51) Int. Cl.⁷ .................. H01L 29/40; H01L 23/12; H01L 23/48
(52) U.S. Cl. .................. 257/684; 257/700; 257/712; 257/713; 257/758; 257/717; 257/720; 257/675; 257/796; 257/784; 257/786; 257/730; 257/668; 257/701
(58) Field of Search ................... 257/700–703, 257/712, 713, 758, 717, 720, 675, 676.796, 784, 786, 668, 730

(56) References Cited

U.S. PATENT DOCUMENTS 6,022,763 A * 2/2000 Ohmori et al. ............. 438/127
2001/0005050 A1 * 6/2001 Ohsawa et al. ............. 257/704
2003/0173577 A1 * 9/2003 Yoon et al. .................. 257/99
2003/0201525 A1 * 10/2003 James et al. ................ 257/686

FOREIGN PATENT DOCUMENTS

| JP | 2-151496 | * 6/1990 | ................ 283/83 |
| JP | 7-335823 | * 12/1995 | |
| JP | 11-265964 | * 9/1999 | |
| JP | 11-307673 A | * 11/1999 | |
| JP | 2001-85450 | * 3/2001 | |
| JP | 2002-118196 | * 4/2002 | |

* cited by examiner

Primary Examiner—Alexander Oscar Williams
(74) Attorney, Agent, or Firm—Fish & Richardson P.C.

(57) ABSTRACT

It is difficult to check the mounted state of solder by means of visual inspection after the mounting of a semiconductor device according to a conventional art, in particular, a CSP-semiconductor device, to a substrate and a problem arises wherein defective products increase and yield decreases. Terminals 50, 51, 52 and 53 for external connection are exposed from second main surface 412 of first insulating substrate 41 in the semiconductor device according to the present invention. Thus, second insulating substrate 48 is adhered to second main surface 412 so as to surround the internal portions of these terminals for external connection. Thereby, second insulating substrate 48 serves as a background mirror so that the mounted state of deep portions of the solder can be ascertained at the time of visual inspection of the mounted state of solder after the mounting of the semiconductor device to the substrate. As a result, the mounted state of the solder can be inspected without failure so that reduction in the number of defective products and increased yield can be attained.

17 Claims, 6 Drawing Sheets

SEMICONDUCTOR DEVICE WITH EXPOSED ELECTRODES

BACKGROUND OF THE INVENTION

1. Field of the Invention

The present invention relates to the mounted state of solder for connecting a substrate to electrodes for external connection of a semiconductor device in a mounting structure and, in particular, relates to a chip size package (CSP) type semiconductor device wherein visual inspection can be carried out.

2. Description of the Related Art

Semiconductor elements separated from a wafer by means of dicing are secured to lead frames in an assembly process for a semiconductor device according to a conventional art. After that, the semiconductor elements are sealed in a transfer mold. Then, the lead frames and resin layer are cut into individual semiconductor devices. A semiconductor device obtained by such a process has, for example, a structure as shown in FIG. 6 wherein the outside of semiconductor element 1 is covered with a resin layer 2 and lead terminals 3 for external connection are led out from the sides of this resin layer 2. This structure is disclosed in, for example, Japanese Unexamined Patent Publication Hei-05-129473.

Thus, this structure has problems with the process precision of the lead frame and with the precision of positioning vis-à-vis dies due to the protrusion of lead terminals 3 out of resin layer 2. Therefore, there is a limitation to the scaling down of the external dimensions and of the area required for mounting the semiconductor device.

Recently, a wafer-scale CSP having outer dimensions that can be scaled down to dimensions equal to, or very close to, the size of a semiconductor chip has attracted attention. In order to manufacture the above, first, a large number of semiconductor elements 12 are formed by carrying out pre-processing such as diffusion of a variety of types to a semiconductor wafer 11, as shown in FIG. 7(A). Next, as shown in FIG. 7(B), the top of semiconductor wafer 11 is covered with a resin layer 13 so that electrodes 14 for external connection are lead out from the surface of resin layer 13. After that, semiconductor elements 12 are divided along dicing lines 15 of semiconductor wafer 11 so as to obtain a completed product, as shown in FIG. 7(C). Resin layer 13 only covers the top surfaces (in some cases the rear surfaces are also covered) of semiconductor elements 12 and silicon semiconductor substrates are exposed from the sidewalls of semiconductor elements 12. An electrode 14 is electrically connected to an integrated circuit network formed beneath resin layer 13. Thus, the mounting of this semiconductor device is implemented by oppositely adhering electrodes 14 to the conductive pattern formed on a substrate.

Such a semiconductor device has a package size that is equal to the chip size of a semiconductor element and can be oppositely adhered to a substrate and, therefore, there is an advantage wherein the area required for mounting can be greatly reduced. In addition, there is an advantage wherein the post-processing costs can be reduced. This structure is disclosed in, for example, Japanese Unexamined Patent Publication Hei-9-64049.

The semiconductor device according to the conventional art shown in FIG. 6 is connected to a conductive pattern on a substrate, for example, via lead terminals 3, while the semiconductor device shown in FIG. 7 according to the conventional art is connected to a conductive pattern on a substrate, for example, via electrodes 14, as described above. That is to say, lead terminals 3 or electrodes 14, respectively, are secured to a conductive pattern on a substrate via, for example, solder. At this time visual inspection of the solder after mounting can easily be carried out after the semiconductor device has been secured to a conductive pattern on a substrate in the case wherein the semiconductor device has a structure wherein lead terminals 3 are lead out to the outside of resin layer 2, as shown in FIG. 6. On the other hand, electrodes 14 are located on the surface of the semiconductor device in the case wherein the semiconductor device is of a CSP type, as shown in FIG. 7. Therefore, a problem arises wherein visual inspection of the mounted state of the solder is difficult to carry out because the solder after mounting is located on the rear surface of the microscopic semiconductor device after the semiconductor device is secured to a conductive pattern of a substrate.

In addition, the semiconductor device shown in FIG. 6 has a problem wherein there is a limit to the degree to which the area required for mounting the semiconductor device can be scaled down because of the protrusion of lead terminals 3 out of resin layer 2, as described above. Therefore, there is a problem in the semiconductor market at the present time such that there is a demand for a CSP-type semiconductor device wherein visual inspection of the mounted state of the solder after mounting of the semiconductor device can easily be carried out.

SUMMARY OF THE INVENTION

The present invention provided in view of the above described problem concerning the conventional art and a semiconductor device according to the present invention comprises: a first substrate formed of an insulating material having at least one through hole; a semiconductor element secured to a desired position of a conductive pattern formed on a first main surface of the above described first substrate; a metal wire for electrically connecting an electrode pad of the above described semiconductor element to the above described desired conductive pattern; a plurality of electrodes for external connection on a second main surface of the above described first substrate located opposite to the first main surface of the above described first substrate that is electrically connected to the above described desired conductive pattern via the above described through hole; a resin mold formed so as to cover, at least, the main surfaces of the above described first substrate, wherein the semiconductor device is characterized in that a second substrate formed of an insulating material having approximately the same coefficient of linear expansion as the above described first substrate is adhered to the second main surface of the above described first substrate so that, at least, the above described electrodes for external connection are exposed.

The semiconductor device of the present invention is preferably characterized in that the above described second substrate is adhered to the above described first substrate so that, at least, the sides of the above described electrodes for external connection located in the vicinity of the outer sides of the second main surface of the above described first substrate are exposed from the above described outer sides.

Furthermore, the semiconductor device of the present invention is preferably characterized in that the above described second substrate separates from each other the above described electrodes for external connection on the second main surface of the above described first substrate so that the electrodes exist independently in separate regions.

DESCRIPTION OF THE PREFERRED EMBODIMENTS

A semiconductor device of the present invention is described in detail below with reference to FIG. 1 through FIG. 5.

Figure 1A:
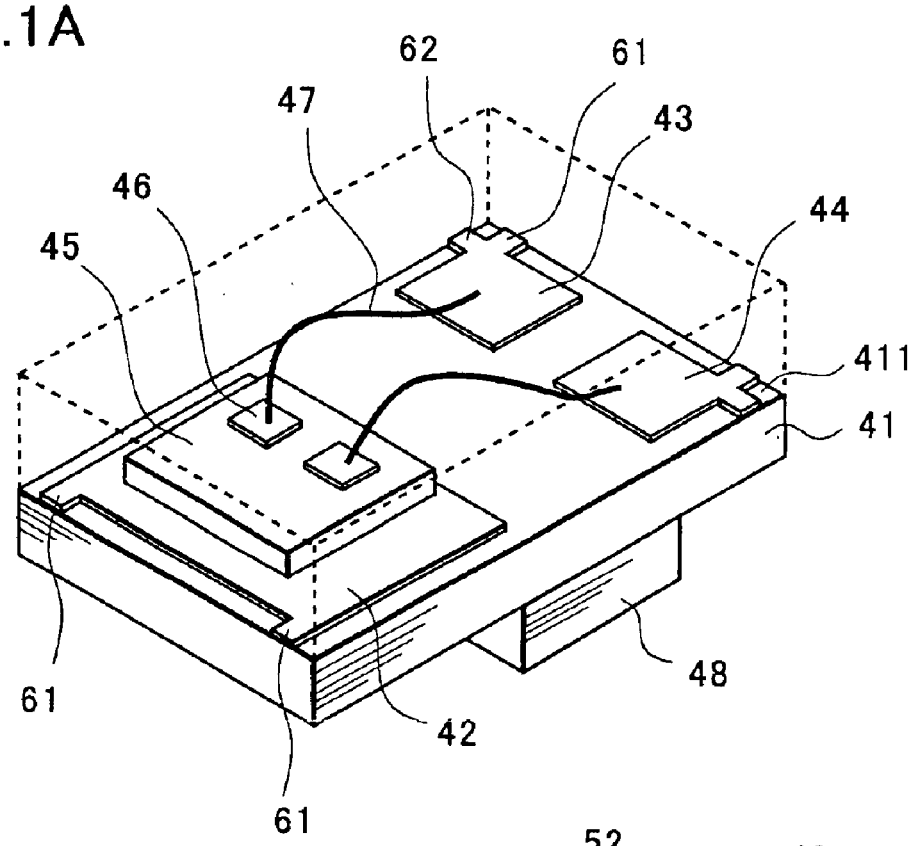
FIG. 1(A) is a perspective view of the front surface side of a semiconductor device according to the present invention.
Figure 1B:
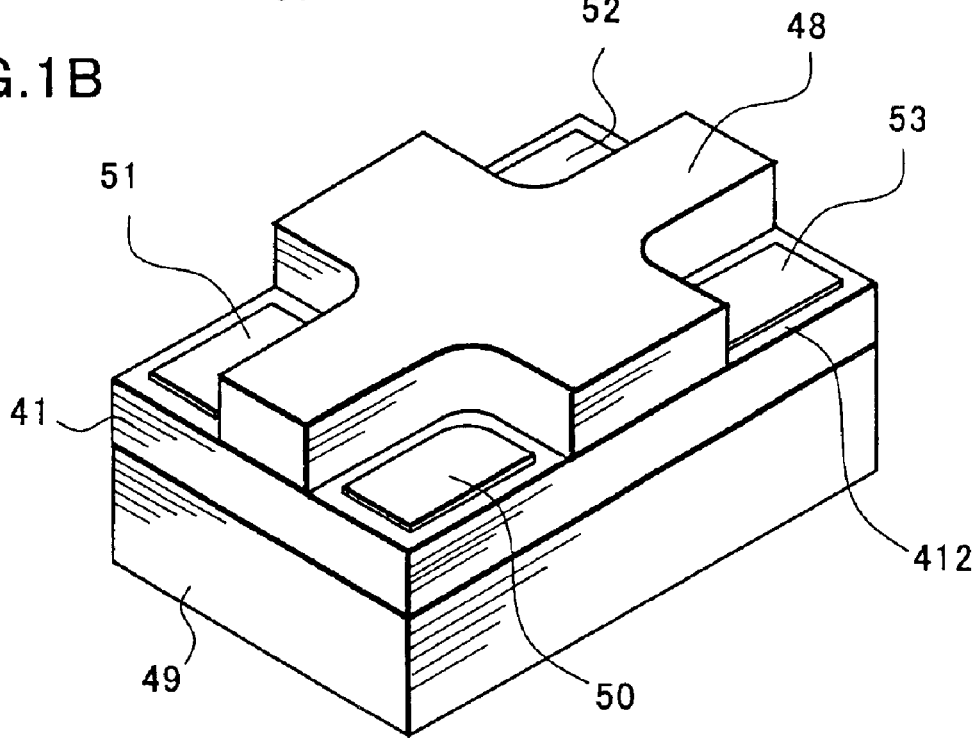
FIG. 1(B) is a perspective view of the rear surface side of the semiconductor device according to the present invention.
Figure 2A:
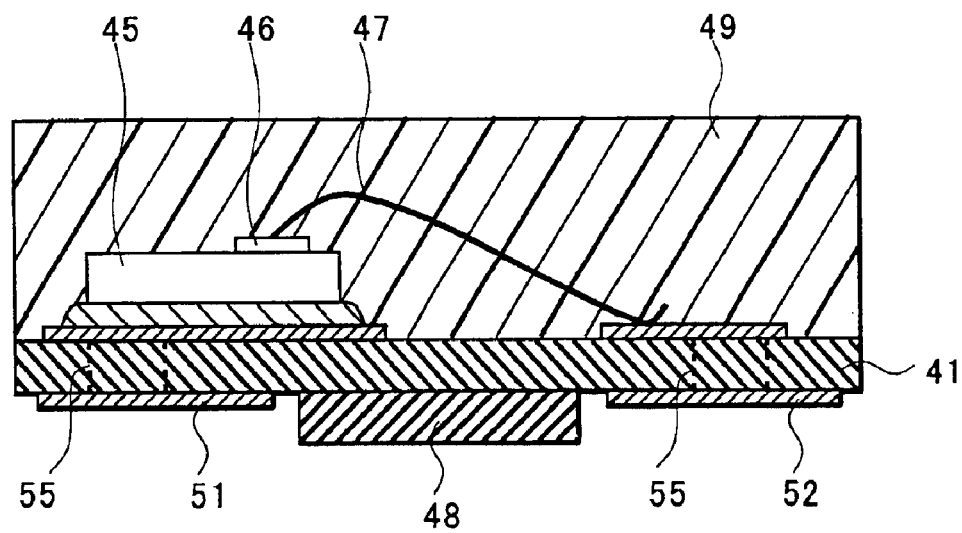
FIG. 2(A) is a cross sectional view of the semiconductor device according to the present invention.
Figure 2B:
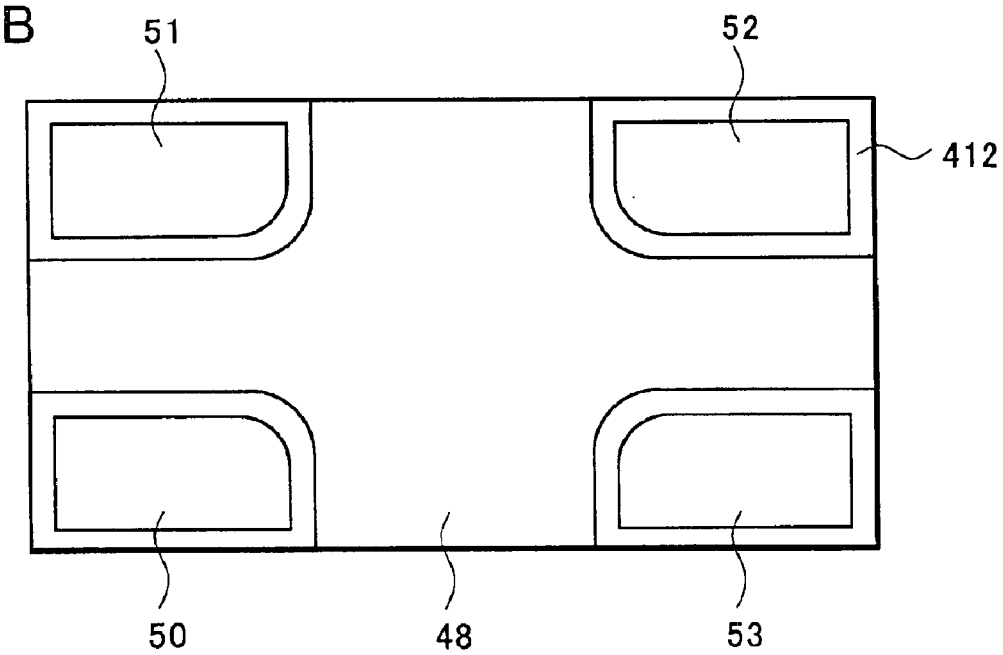
FIG. 2(B) is a plan view of the rear surface side of the semiconductor device according to the present invention.

FIGS. 1(A) and 1(B) are perspective views showing the structure of a semiconductor device of the present invention. FIG. 1(A) is a view of the top surface of the semiconductor device, wherein the resin mold part is represented by dotted lines showing the internal structure of the semiconductor device while FIG. 1(B) shows the structure of the rear surface side of the semiconductor device. In addition, FIG. 2(A) is a cross sectional view of the semiconductor device of the present invention and FIG. 2(B) is a plan view of the rear surface side of the semiconductor device of the present invention.

As shown in FIG. 1(A) an individual insulating substrate 41 separated from a large substrate 59 (see FIG. 4) is made of an insulating material, such as ceramic or glass epoxy, with a substrate thickness of from approximately 0.1 mm to 0.2 mm. In addition, as shown in FIG. 2(B), insulating substrate 41 has a rectangular shape wherein a long side×a short side is approximately 1.0 mm×0.8 mm. Moreover, substrate 41 has a first main surface 411 on the top surface side and a second main surface 412 on the rear surface side, wherein these surfaces 411 and 412 extend parallel to each other.

Moreover, first main surface 411 of substrate 41 is formed to be flat and a metal paste, such as tungsten, is printed on the surface thereof so as to form an island portion 42 and electrode portions 43 and 44. Here, island portion 42 and electrode portions 43 and 44 are plated with gold by means of an electrolytic plating method. Thus, a semiconductor chip 45, such as with a Schottky barrier diode or a MOSFET element, is die bonded to island portion 42 of substrate 41. Electrode pads 46 formed on the surface of semiconductor chip 45 are electrically connected to electrode portions 43 and 44 by means of metal wires 47.

Figure 4A:
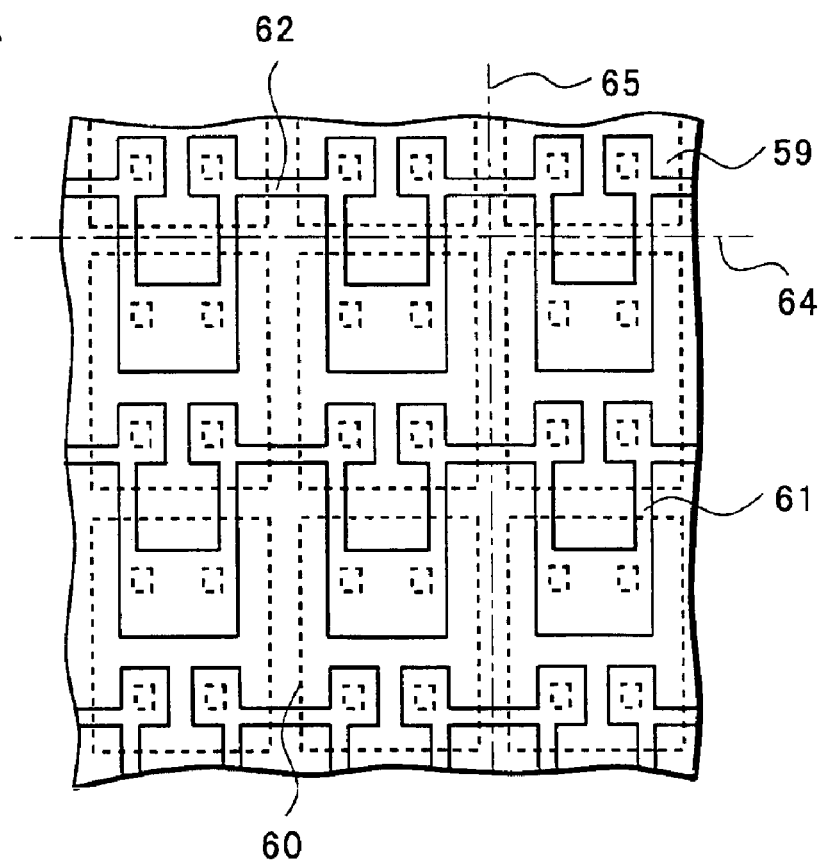
FIG. 4(A) is a plan view of the semiconductor device according to the present invention.

Here, as shown in FIG. 4(A), portions 60 to be mounted surrounded by dotted lines are arranged longitudinally and latitudinally on a large substrate 59 at intervals of 0.02 mm to 0.05 mm according to the present embodiment. Thus, first connection portions 61 extend from island portion 42 as a continuous pattern. The width of these line portions are narrower than island portion 42 and extend so as to have a line width of, for example, 0.1 mm. First connection portions 61 are connected to electrode portions 43 and 44 of the next mounting portion 60 across dicing line 64. Furthermore, second connection portions 62 extend from electrode portions 43 and 44, respectively, in the direction perpendicular to first connection portions 61 and are connected to electrode portions 43 and 44 of the next mounting dicing portions 60 across dicing lines 65. Second connection portions 62 are, furthermore, connected to a common connection portion (not shown) surrounding the periphery of the group of mounting portions 60. First and second connection portions 61 and 62 extend in the above manner and, thereby, island portions 42 as well as electrode portions 43 and 44 of the respective mounting portions 60 are electrically connected to each other. These portions connected in this manner are used as a common electrode at the time when electrolytic plating, such as gold plating, is carried out.

First and second connection portions 61 and 62 between substrate 41 and resin mold 49 are microscopically exposed from the sides. Here, island portion 42 as well as electrode portions 43 and 44 are formed in places located from approximately 0.05 mm to 0.1 mm inside away from the outer periphery of first main surface 411 and, therefore, island portion 42 as well as electrode portions 43 and 44 between substrate 41 and resin mold 49 are not exposed from the sides.

Figure 3:
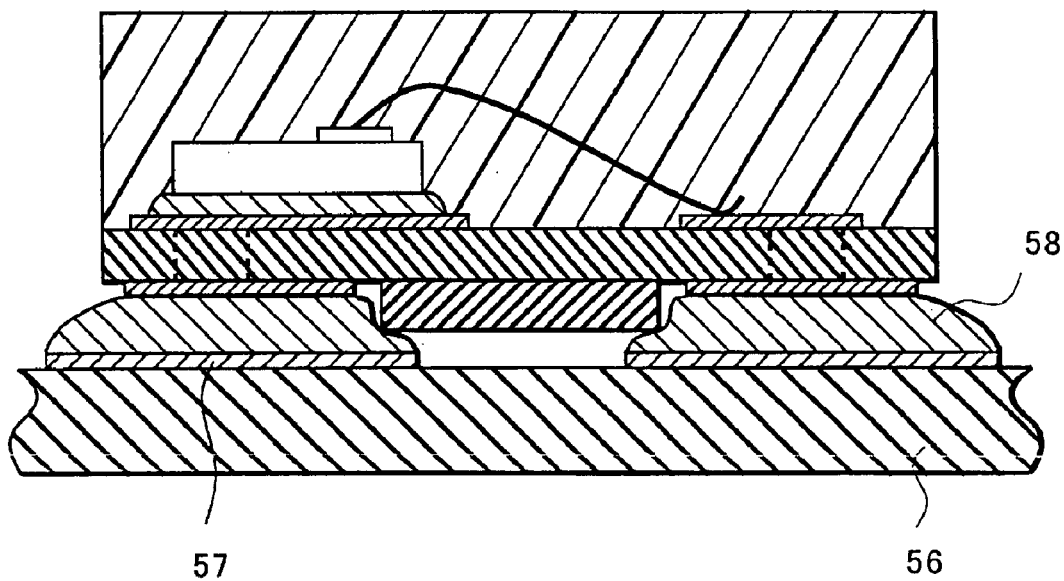
FIG. 3 is a cross sectional view of the semiconductor device according to the present invention.

Terminals 50, 51, 52 and 53 for external connection are formed on second main surface 412 of substrate 41 by means of the printing of a metal paste, such as tungsten, as shown in FIG. 1(B). Furthermore, the semiconductor device of the present invention is characterized in that a second insulating substrate 48 is adhered to substrate 41 so as to cover second main surface 412 exposed from terminals 50, 51, 52 and 53 for external connection. Second insulating substrate 48 is made of an insulating material, such as ceramic or glass epoxy, in the same manner as for first insulating substrate 41 and has the same thickness as first substrate 41. That is to say, first substrate 41 and second substrate 48 are made of the same material so as to have the same coefficients of linear expansion and, thereby, a structure is obtained wherein cracks in the substrate due to heat can be prevented. Here, although in the present embodiment the thicknesses of first substrate 41 and second substrate 48 are approximately the same, the thicknesses thereof are not particularly limited. The thickness of second substrate 48 is, at least, the same as, or greater than, the thickness of terminals 50, 51, 52 and 53 for external connection and a variety of modifications are possible in a range wherein the thickness of second substrate 48 is less than the thickness of solder 58 at the time when solder 58 is secured to a conductive path 57 on a substrate 56, as shown in FIG. 3.

A through hole 55 that starts from first main surface 411 and ends at second main surface 412 is provided in substrate 41 on which island portion 42 as well as electrode portions 43 and 44 are formed, as shown in FIG. 2(A). The inside of through hole 55 is filled in with a conductive material, such as tungsten, silver or copper, and island portion 42 is electrically connected to terminals 50 and 51 for external connection. On the other hand, electrode portions 43 and 44, respectively, are electrically connected to terminals 52 and 53 for external connection. The edges of terminals 50, 51, 52 and 53 for external connection are located from approximately 0.01 mm to 0.1 mm inside away from the edges of substrate 41. In addition, the portions of electrode portions 43 and 44 above through holes 55 are not flat and, therefore, it is preferable for metal wires 47 to be connected to the portion of each of electrode portions 43 and 44 other than the portion above through hole 55. Here, as described above, through hole 55 is created entirely within first substrate 41. Thus, through holes 55, respectively, are covered by island portion 42, electrode portions 43 and 44 as well as terminals 50, 51, 52 and 53 for external connection on first main surface 411 and second main surface 412 of first substrate 41. Therefore, through holes 55 and the conductive material inside thereof cannot be viewed from the outside of the semiconductor device due to the structure thereof.

As shown in FIG. 2(B), an active element with three terminals, such as a bipolar transistor or a power MOSFET, for example, is formed as semiconductor element 45. Terminals 50 and 51 for external connection formed beneath the rear surface of island portion 42 are collector terminals and terminals 52 and 53 for external connection formed beneath the rear surface of electrode portions 43 and 44, respectively, are base and emitter terminals in the case wherein a bipolar element is mounted. Here, semiconductor element 45 used in the present invention is not limited to the above described element but, rather, a variety of modifications are possible depending on the purpose of utilization.

Figure 4B:
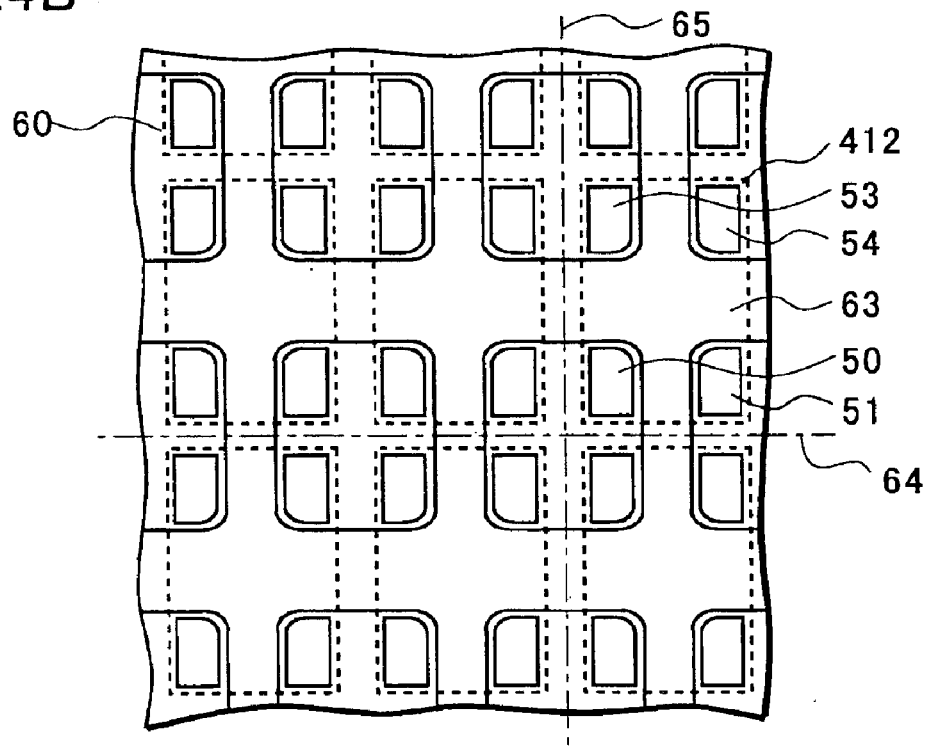
FIG. 4(B) is a plan view of the semiconductor device according to the present invention.

Furthermore, the present invention is characterized in that terminals 50, 51, 52 and 53 for external connection are formed from approximately 0.05 mm to 0.1 mm inside away from the outer periphery of second main surface 412. As shown in FIG. 4(B), second insulating substrate 48 is first adhered to large substrate 59 before the formation of terminals 50, 51, 52 and 53 for external connection according to the present invention. At this time second insulating substrate 48 is formed of large substrate 63 in the same manner as first insulating substrate 41. Thus, one piece of large substrate 63, in which openings are provided in the regions of each of mounting portions 60 where terminals 50, 51, 52 and 53 for external connection are formed, is adhered to a large substrate 59 for first insulating substrate 41.

After that, terminals 50, 51, 52 and 53 for external connection are plated with gold by means of an electrolytic method wherein respective terminals 50, 51, 52 and 53 for external connection are formed as independent patterns, as shown in the drawings. As described above, however, island portions 42 as well as electrode portions 43 and 44 of respective mounting portions 60 are electrically connected to each other through a common connection portion (not shown) surrounding the periphery of the group of mounting portions 60 on first main surface 411 of first substrate 41. Thus, respective terminals 50, 51, 52 and 53 for external connection are electrically connected to island portions 42 as well as electrode portions 43 and 44 via respective through holes 55. Thereby, all of terminals 50, 51, 52 and 53 for external connection can be plated with gold at one time by means of an electrolytic plating method using the common connection on first main surface 411, although terminals 50, 51, 52 and 53 for external connection, respectively, are independently formed on second main surface 412.

According to the present invention only first and second connection portions 61 and 62, having microscopic line widths, are exposed to the outside from the interface between first main surface 411 on first insulating substrate 41 and resin mold 49. In other words, terminals 50, 51, 52 and 53 for external connection are formed from approximately 0.05 mm to 0.1 mm inside away from the outer periphery of second main surface 412 of substrate 41 according to the present invention. That is to say, only first and second connection portions 61 and 62, having narrow line widths, cross dicing lines 64 and 65 according to the present invention. Thereby, dicing can be carried out without the occurrence of burrs in terminals 50, 51, 52 and 53 for external connection at the time when large substrates 59 and 63 are diced and divided into individual semiconductor devices. As a result, defective mounting due to burrs on terminals for external connection does not occur at the time when a semiconductor device is mounted on conductive path 57 of substrate 56, as shown in FIG. 3. In addition, the semiconductor device of the present invention is microscopic and is mounted to a microscopic pattern via solder as described above and short circuiting due to burrs on terminals for external connection does not occur in this microscopic pattern.

A plurality of mounting portions 60 formed on large substrate 59 is divided into individual semiconductor devices and, then, a semiconductor device of the present invention is completed, as shown in FIG. 1. After that, this semiconductor device is mounted to conductive path 57 formed on substrate 56 via, for example, solder 58 as shown in FIG. 3. At this time a CSP-type semiconductor device with terminals for external connection on the rear surface requires a small area for mounting, like the semiconductor device of the present invention, and, therefore, there is a high demand for CSP-type semiconductor devices as ultra-small, ultra-light packages for cellular phones, cameras, and the like, in today's semiconductor market. A problem arises, however, wherein it is difficult, in particular, to observe the mounted state of the solder at the time of visual inspection after a semiconductor device of the present invention has been mounted to substrate 56 because the size of such a semiconductor device can be, for example, as microscopic as L×W×T (length×width ×thickness)=1.0 mm×0.8 mm×0.6 mm, as described above. That is to say, visual inspection is a non-destructive inspection that is, in many cases, carried out by the naked eye and such visual inspection is difficult by regard to microscopic patterns. Thus, a magnifying glass or an automatic optical inspection (AOI) unit may be utilized to carry out visual inspection in the case wherein inspection by the naked eye is difficult. In actuality, however, visual inspection becomes difficult as the semiconductor device is miniaturized even in the case wherein a magnifying glass or an automatic optical inspection (AOI) unit is utilized.

Therefore, second insulating substrate 48 is centrally formed so as to partially surround terminals 50, 51, 52 and 53 for external connection on the second main surface of the substrate, as shown in FIG. 1(B) and FIG. 2(B), of the semiconductor device of the present invention. That is to say, terminals 50, 51, 52 and 53 for external connection are separated by second substrate 48 so as to have individual regions for formation on second main surface 412 of first substrate 41. In addition, the thickness of second insulating substrate 48 is set to be thinner than the thickness of solder 58 at the time that the semiconductor device is mounted to substrate 56, as described above. Thus, the thickness of the semiconductor device of the present invention is not increased by the thickness of second insulating substrate 48 after second insulating substrate 48 is mounted to substrate 56. Moreover, the depth of the solder can be observed using an automatic optical inspection unit by placing second insulating substrate 48 in the above described position. This is because an inspection by means of an image of the semiconductor device as viewed from the diagonally above semiconductor device is conventionally carried out in accordance with visual inspection using an automatic optical inspection unit and, at this time, second insulating substrate 48 located behind solder 58 serves as a background mirror. Thereby, light at the time of inspection is reflected from second insulating substrate 48 so that the depth of solder 58 can be observed without failure. As a result, the mounted state of the solder on the rear surface of the semiconductor device can be confirmed so that defective mounting of solder can be detected without failure through visual inspection. Thereby, reduction in the number of defective products and increased yield can be attained.

In addition, although terminals 50, 51, 52 and 53 for external connection, respectively, are formed at intervals of approximately 0.3 mm in the semiconductor device of the present invention, short circuiting, due to solder 58, between the respective terminals for external connection can be prevented from occurring by positioning the insulating substrate between the respective terminals for external connection. Furthermore, second substrate 48 is located at the center of the rear surface of the semiconductor device and, thereby, the solder used for mounting the semiconductor device to the substrate tends to shift to the outside. That is to say, the semiconductor device of the present invention has a structure wherein solder fillets can easily be exposed from the sides of the semiconductor device so that the mounted state of the solder can easily be observed by the naked eye after mounting.

Figure 5:
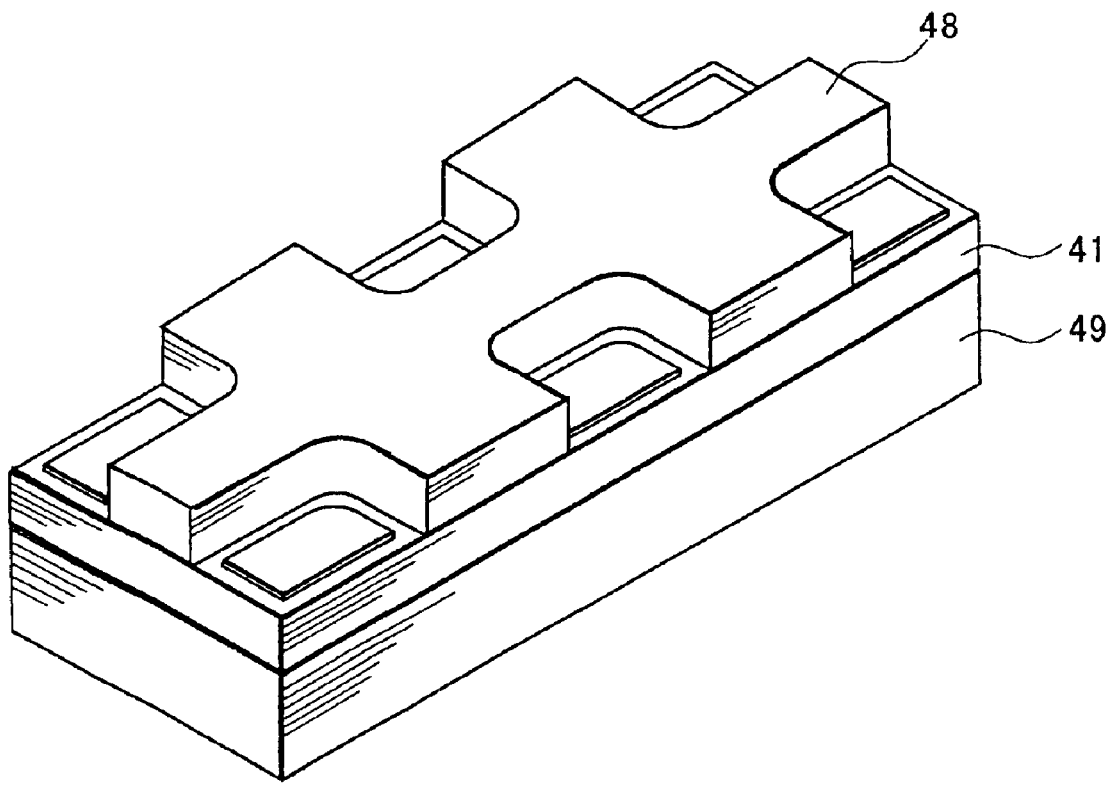
FIG. 5 is a perspective view showing the rear surface side of a semiconductor device according to the second embodiment of the present invention.
Figure 6:
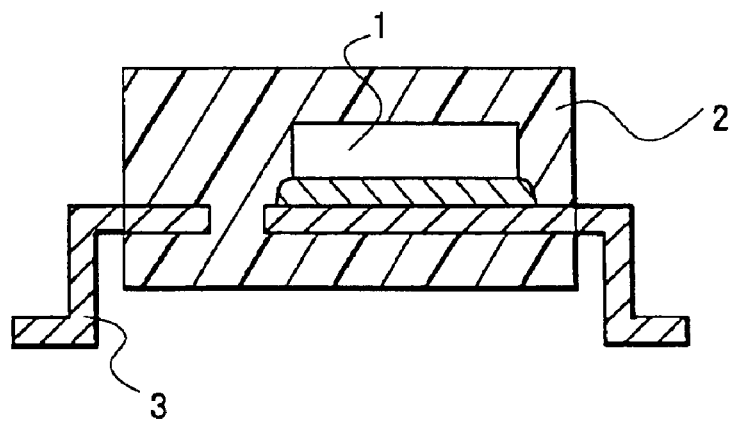
FIG. 6 is a cross sectional view of a semiconductor device according to a conventional art.
Figure 7A:
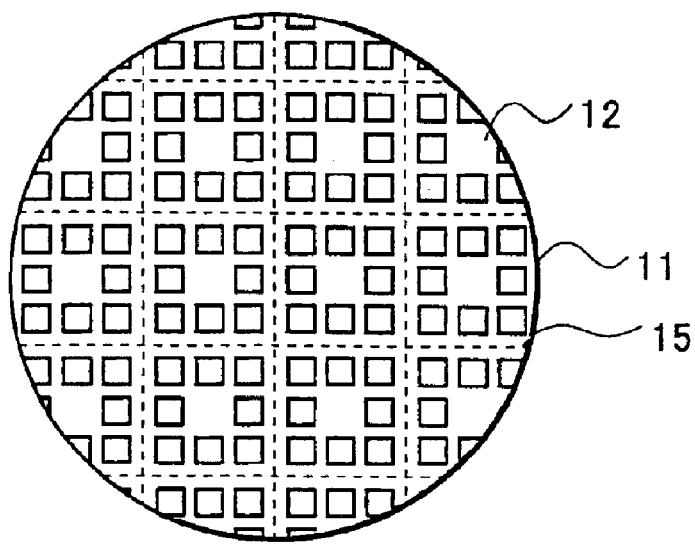
FIG. 7(A) is a plan view showing a manufacturing method for the semiconductor device according to the conventional art.
Figure 7B:
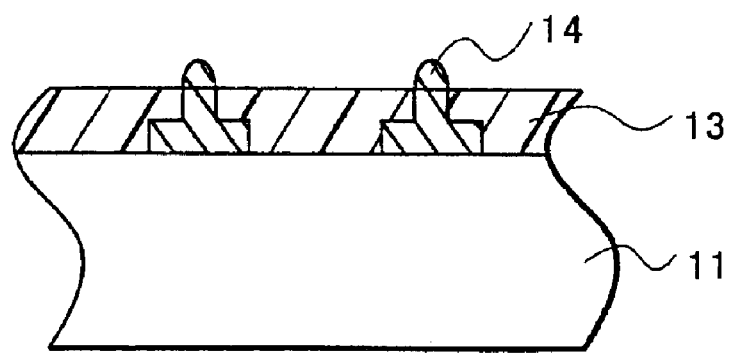
FIG. 7(B) is a cross sectional view showing the manufacturing method for the semiconductor device according to the conventional art.
Figure 7C:
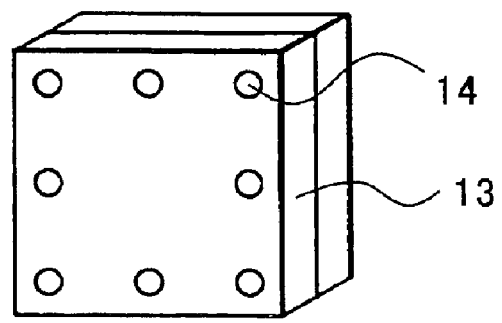
FIG. 7(C) is a perspective view showing the manufacturing method for the semiconductor device according to the conventional art.

Here, although the present invention is described in a form wherein four terminals for external connection are exposed from the rear surface of the semiconductor device, the present invention is not particularly limited to this. A form wherein six terminals, for example, for external connection are exposed, as shown in FIG. 5, can obtain the same effects without changing the form of second insulating substrate 48. In addition to the above, a variety of modifications are possible in a range wherein the gist of the present invention does not deviate from.

The semiconductor device of the present invention is, first, characterized in that the second insulating substrate is adhered to the second main surface of the first insulating substrate from which the terminals for external connection are exposed so as to centrally surround the terminals for external connection, as described above. Thereby, the second insulating substrate can be used as a background mirror at the time of visual inspection of the mounted state of the solder after the semiconductor device is mounted to the substrate according to the present invention. As a result, the mounted state of the solder, which is difficult to visually inspect, located on the rear surface of the semiconductor device and reaching to the rear can be confirmed so that reduction in the number of defective products and increased yield can be attained.

The semiconductor device of the present invention is, second, characterized in that the terminals for external connection are formed so as to be located inside away from the outer periphery of the second main surface of the first insulating substrate. Thereby, a large substrate having a large number of mounting portions is divided into individual semiconductor devices by dicing the substrate after resin molding and, at this time, the occurrence of burrs in the terminals for external connection can be prevented according to the present invention. As a result, short circuiting due to burrs in a terminal for external connection can be prevented without failure at the time of the mounting of a microscopic semiconductor device, such as the semiconductor device of the present invention, to a microscopic pattern.

The semiconductor device of the present invention is, third, characterized in that the first insulating substrate and the second insulating substrate are both ceramic substrates. Thereby, the first and second insulating substrates can have identical coefficients of linear expansion and, thereby, product quality can be improved, wherein substrate cracking is prevented.

What is claims is:

1. A semiconductor device, comprising:
    a first substrate formed of an insulating material having at least one through hole;
    a semiconductor element secured to a desired position of a conductive pattern formed on a first main surface of the first substrate;
    a plurality of electrodes for external connection on a second main surface of the first substrate located opposite to the first main surface of the first substrate that is electrically connected to the desired conductive pattern via the through hole;
    a resin mold formed so as to cover, at least, the main surfaces of the first substrate,
    wherein the semiconductor device is characterized in that a second substrate formed of an insulating material having approximately a same coefficient of linear expansion as the first substrate is adhered to the second main surface of the first substrate so that, at least, the electrodes are exposed; and
    wherein a portion of the second substrate passes between at least two of the electrodes and extends from the second main surface at least as far as the electrodes extend from the second main surface.

2. The semiconductor device according to claim 1, wherein the second substrate is adhered to the first substrate so that, at least, the sides of the electrodes located in the vicinity of outer sides of the second main surface of the first substrate are exposed from the outer sides.

3. The semiconductor device according to claim 1, wherein the second substrate separates the electrodes from each other so that the electrodes exist independently in separate regions.

4. The semiconductor device according to claim 2, wherein the second substrate is thicker than the electrodes for external connection.

5. The semiconductor device according to claim 2, wherein the electrodes are plated with gold.

6. The semiconductor device according to claim 2, wherein the first and second substrates are ceramic substrates.

7. The semiconductor device according to claim 2, wherein the second substrate separates the electrodes from each other so that the electrodes exist independently in separate regions.

8. The semiconductor device according to claim 3, wherein the second substrate is thicker than the electrodes.

9. The semiconductor device according to claim 3, wherein the electrodes are plated with gold.

10. The semiconductor device according to claim 3, wherein the first and second substrates are ceramic substrates.

11. The semiconductor device according to claim 1, comprising a metal wire to electrically connect an electrode pad of the semiconductor element to the desired conductive pattern.

12. A method for forming a semiconductor device, comprising:

adhering a second substrate to a second surface of a first substrate;

subsequently mounting a semiconductor element on a first surface of the first substrate; and electrically coupling the semiconductor element to one or more electrodes on the second surface of the first substrate, wherein the electrodes are exposed;

wherein adhering the second substrate comprises positioning the second substrate such that a portion of the second substrate passes between at least two of the electrodes and extends from the second surface at least as far as the electrodes extend from the second surface.

13. The method of claim 12, wherein a thickness of the second substrate is greater than a thickness of the electrode.

14. The method of claim 12, wherein a coefficient of expansion of the first substrate and a coefficient of expansion of the second substrate are substantially equal.

15. The semiconductor device according to claim 1, wherein the portion of the second substrate extends from the second main surface farther than the electrodes extend from the second main surface.

16. The semiconductor device according to claim 1, wherein the second main surface defines an outer periphery thereof and wherein each terminal is exposed at the second main surface at a position that is a distance inside the outer periphery.

17. The semiconductor device according to claim 16, wherein the distance is between approximately 0.05 mm and 0.1 mm.

* * * * *